United States Patent
Song et al.

(10) Patent No.: US 8,358,060 B2
(45) Date of Patent: Jan. 22, 2013

(54) ORGANIC LIGHT EMITTING DEVICE AND METHOD FOR MANUFACTURING THE SAME

(75) Inventors: Jung-Bae Song, Seongnam-si (KR); Sung-Hun Lee, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 309 days.

(21) Appl. No.: 12/498,182

(22) Filed: Jul. 6, 2009

(65) Prior Publication Data

US 2010/0156280 A1 Jun. 24, 2010

(30) Foreign Application Priority Data

Dec. 19, 2008 (KR) ........................ 10-2008-0130301

(51) Int. Cl.
*H01J 1/62* (2006.01)
*H01J 63/04* (2006.01)
(52) U.S. Cl. .................. 313/504; 313/500; 313/506
(58) Field of Classification Search ........... 313/498–512
See application file for complete search history.

(56) References Cited

U.S. PATENT DOCUMENTS

2005/0249972 A1* 11/2005 Hatwar et al. ................ 428/690
2008/0018239 A1* 1/2008 Matsuda et al. .............. 313/504
2008/0042552 A1  2/2008 Cok
2009/0121239 A1* 5/2009 Asaki et al. ..................... 257/89

FOREIGN PATENT DOCUMENTS

| JP | 2006-005328 | 1/2006 |
| JP | 2007-299729 | 11/2007 |
| JP | 2008-027722 | 2/2008 |
| KR | 10-0497094 | 6/2005 |
| KR | 10-0685847 | 2/2007 |
| KR | 10-0708714 | 4/2007 |
| KR | 10-0729089 | 6/2007 |
| KR | 10-0754127 | 8/2007 |
| KR | 10-0829761 | 5/2008 |

* cited by examiner

*Primary Examiner* — Karabi Guharay
*Assistant Examiner* — Zachary J Snyder
(74) *Attorney, Agent, or Firm* — H.C. Park & Associates, PLC

(57) ABSTRACT

The present invention relates to an organic light emitting device, wherein distances between pixel electrodes and common electrodes of a first pixel, a second pixel, and a third pixel are referred to as a first resonance distance, a second resonance distance, and a third resonance distance, respectively. A resonance order of a first color light for the first resonance distance is lower than at least one of resonance orders of a second color light and a third color light for the second resonance distance and the third resonance distance, respectively.

20 Claims, 4 Drawing Sheets

ORGANIC LIGHT EMITTING DEVICE AND METHOD FOR MANUFACTURING THE SAME

CROSS REFERENCE TO RELATED APPLICATION

This application claims priority from and the benefit of Korean Patent Application No. 10-2008-0130301, filed on Dec. 19, 2008, which is hereby incorporated by reference for all purposes as if fully set forth herein.

BACKGROUND OF THE INVENTION

1. Field of the Invention

The present invention relates to an organic light emitting device and a manufacturing method thereof.

2. Discussion of the Background

An organic light emitting device includes two electrodes and an organic light emitting layer interposed between the two electrodes. One of the two electrodes injects holes and the other injects electrons into the light emitting layer. The injected electrons and holes are combined to form excitons and the excitons emit light as discharge energy. The organic light emitting device is a self-emissive type of display that does not require a light source so it may be advantageous in terms of power consumption, and it may have good response speed, viewing angle, and contrast ratio.

The organic light emitting device may include red pixels, blue pixels, green pixels, and white pixels, and the organic light emitting device may display full colors by combining the light emitted from each of the pixels. Each pixel includes an organic light emitting element and a plurality of thin film transistors for driving them.

The organic light emitting element includes an anode electrode and a cathode electrode, and an organic light emitting member as an emission layer disposed between the electrodes. The organic light emitting member emits light of three primary colors red, green, and blue, or white light. However, when the organic light emitting member emits light mixed with another color among the three primary colors, the display quality may deteriorate.

SUMMARY OF THE INVENTION

The present invention provides an organic light emitting device and a manufacturing method thereof.

Additional features of the invention will be set forth in the description which follows, and in part will be apparent from the description, or may be learned by practice of the invention.

The present invention discloses an organic light emitting device including a first pixel to display a first color light, a second pixel to display a second color light, and a third pixel to display a third color light, wherein the first pixel, the second pixel, and the third pixel respectively include a pixel electrode, a third color organic emission layer disposed on the pixel electrode, and a common electrode disposed on the third color organic emission layer. The first pixel includes a first color organic emission layer disposed between the pixel electrode and the common electrode, and the second pixel includes a second color organic emission layer between the pixel electrode and the common electrode. The distances between the pixel electrode and the common electrode of the first pixel, the second pixel, and the third pixel are referred to as a first resonance distance, a second resonance distance, and a third resonance distance, respectively, and a resonance order of the first color light for the first resonance distance is lower than at least one of resonance orders of the second color light and the third color light for the second resonance distance and the third resonance distance, respectively.

The present invention discloses an organic light emitting device including a red pixel, a green pixel, and a blue pixel, wherein the red pixel, the green pixel, and the blue pixel respectively include a pixel electrode, a blue organic emission layer disposed on the pixel electrode, and a common electrode disposed on the blue organic emission layer, the red pixel includes a red organic emission layer disposed between the pixel electrode and the common electrode, the green pixel includes a green organic emission layer disposed between the pixel electrode and the common electrode, and the distance between the pixel electrode and the common electrode of the red pixel is shorter than the distance between the pixel electrode and the common electrode of the green pixel and blue pixel.

The present invention discloses a method for manufacturing an organic light emitting device including: forming a plurality of pixel electrodes on a substrate; forming a hole injection layer on the pixel electrodes; forming a hole transport layer on the hole injection layer; forming a first distance additional member on the hole transport layer of a green region; forming a second distance additional member on the hole transport layer of a blue region; forming a red organic emission layer on the hole transport layer of a red region; forming a green organic emission layer on the first distance additional member; forming a blue emission layer on the second distance additional member, the red organic emission layer, and the green organic emission layer; forming an electron transport layer on the blue emission layer; forming an electron injection layer on the electron transport layer; and forming a common electrode on the electron injection layer, and when the distances between the pixel electrode and the common electrode of the red, the green, and the blue pixels are referred to as first, second, and third resonance distances, a resonance order of the red color light for the first resonance distance is lower than at least one of resonance orders of the green and blue color lights for the second and third resonance distances.

According to an exemplary embodiment of the present invention, the blue organic emission layer is deposited on the whole surface of the pixel electrode such that the usage of a shadow mask may be reduced and the manufacturing process of the organic light emitting device may be simplified.

Also, according to an exemplary embodiment of the present invention, the resonance order of the red organic emission layer is lower than the resonance order of the green and blue organic emission layers such that the color reproducibility and the light emission efficiency of the organic light emitting device may be increased.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
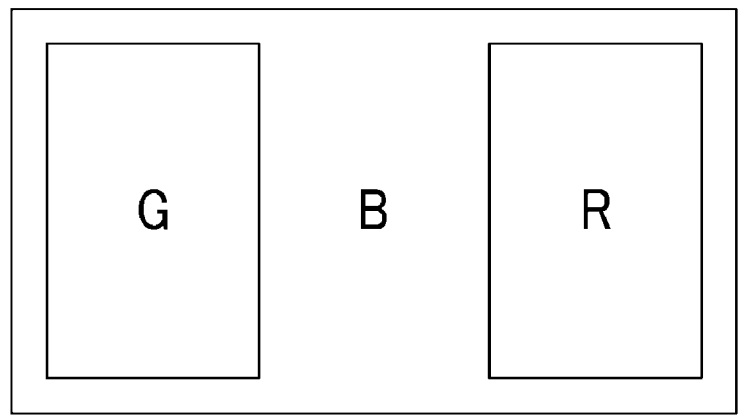
FIG. 1 is a top plan view schematically showing the arrangement of a plurality of pixels in an organic light emitting device according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

An organic light emitting device according to an exemplary embodiment of the present invention will be described in detail with reference to FIG. 1.

FIG. 1 is a top plan view schematically showing the arrangement of a plurality of pixels in an organic light emitting device according to an exemplary embodiment of the present invention.

Referring to FIG. 1, an organic light emitting device according to an exemplary embodiment of the present invention includes a red pixel R for displaying a red color, a green pixel G for displaying a green color, and a blue pixel B for displaying a blue color. The red color, the green color, and the blue color is an example of basic colors that may be combined to display full colors in the organic light emitting device. The red pixels R, green pixels G, and blue pixels B may be basic pixels, which light emitted therefrom may be combined to display full colors. In the present exemplary embodiment, three pixels forming one group are repeated according to a row and column.

In the present exemplary embodiment, the red pixel R, the green pixel G, and the blue pixel B, the plurality of red pixels R and the plurality of green pixels G are alternately arranged according to rows.

The red pixel R, the green pixel G, and the blue pixel B may have substantially the same area.

FIG. 1 shows a region of the blue pixel B enclosing the red pixel R and the green pixel G. The blue organic emission layer is formed on the whole surface of the region shown in FIG. 1 as well as the region of the blue pixel B.

In the present exemplary embodiment, the shape and arrangement of the pixels may be variously changed, and a different pixel such a white pixel displaying a white color may be further included.

Next, one pixel of an organic light emitting device according to an exemplary embodiment of the present invention will be described with reference to FIG. 2 as well as FIG. 1.

Figure 2:
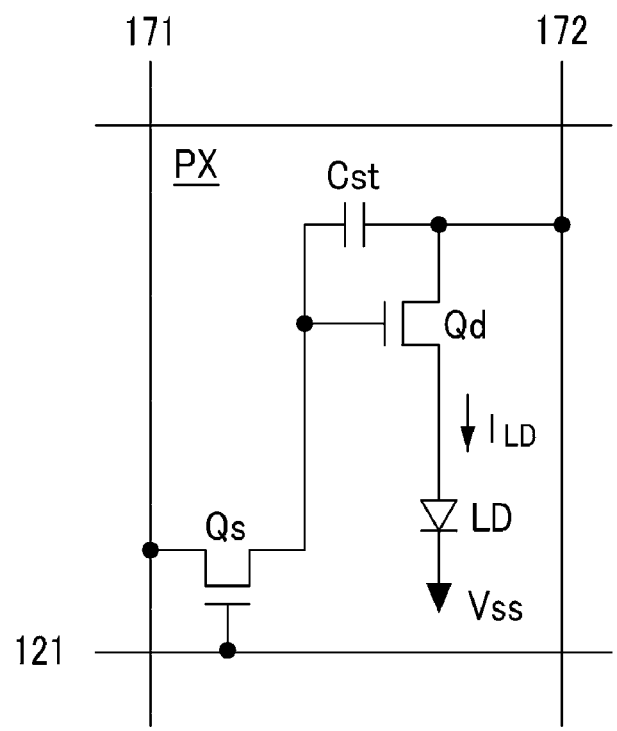
FIG. 2 is an equivalent circuit diagram of one pixel in an organic light emitting device according to an exemplary embodiment of the present invention.

FIG. 2 is an equivalent circuit diagram of one pixel in an organic light emitting device according to an exemplary embodiment of the present invention.

Referring to FIG. 2, an organic light emitting device according to the present exemplary embodiment includes a plurality of signal lines 121, 171, and 172, and a pixel PX connected thereto. The pixel PX may be one of the red pixel R, the green pixel G, and the blue pixel B shown in FIG. 1.

The signal lines include a plurality of scanning signal lines 121 for transmitting gate signals (or scanning signals), a plurality of data lines 171 for transmitting data signals, and a plurality of driving voltage lines 172 for transmitting a driving voltage. The scanning signal lines 121 extend in a row direction and are substantially parallel to each other, and the data lines 171 extend in a column direction and are substantially parallel to each other. The driving voltage lines 172 extend in a column direction and are substantially parallel to each other, however they may extend in the row direction or the column direction, and may form a mesh shape.

One pixel PX includes a switching transistor Qs, a driving transistor Qd, a capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current $I_{LD}$ having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element LD as an organic light emitting diode (OLED) has an anode connected to the output terminal of the driving transistor Qd and a cathode connected to a common voltage Vss. The organic light emitting element LD emits light having an intensity depending on an output current $I_{LD}$ of the driving transistor Qd. The organic light emitting element LD may include an organic material that emits light of at least one of three primary colors of red, green, and blue. The organic light emitting device displays desired images by a spatial sum of the red, green, and blue colored light.

The switching transistor Qs and the driving transistor Qd are n-channel field effect transistors (FETs), however at least one may be a p-channel FET. In addition, the connections among the transistors Qs and Qd, the capacitor Cst, and the organic light emitting diode LD may be modified.

Next, a cross-sectional structure of an organic light emitting device according to an exemplary embodiment of the present invention will be described with reference to FIG. 3 as well as FIG. 2.

Figure 3:
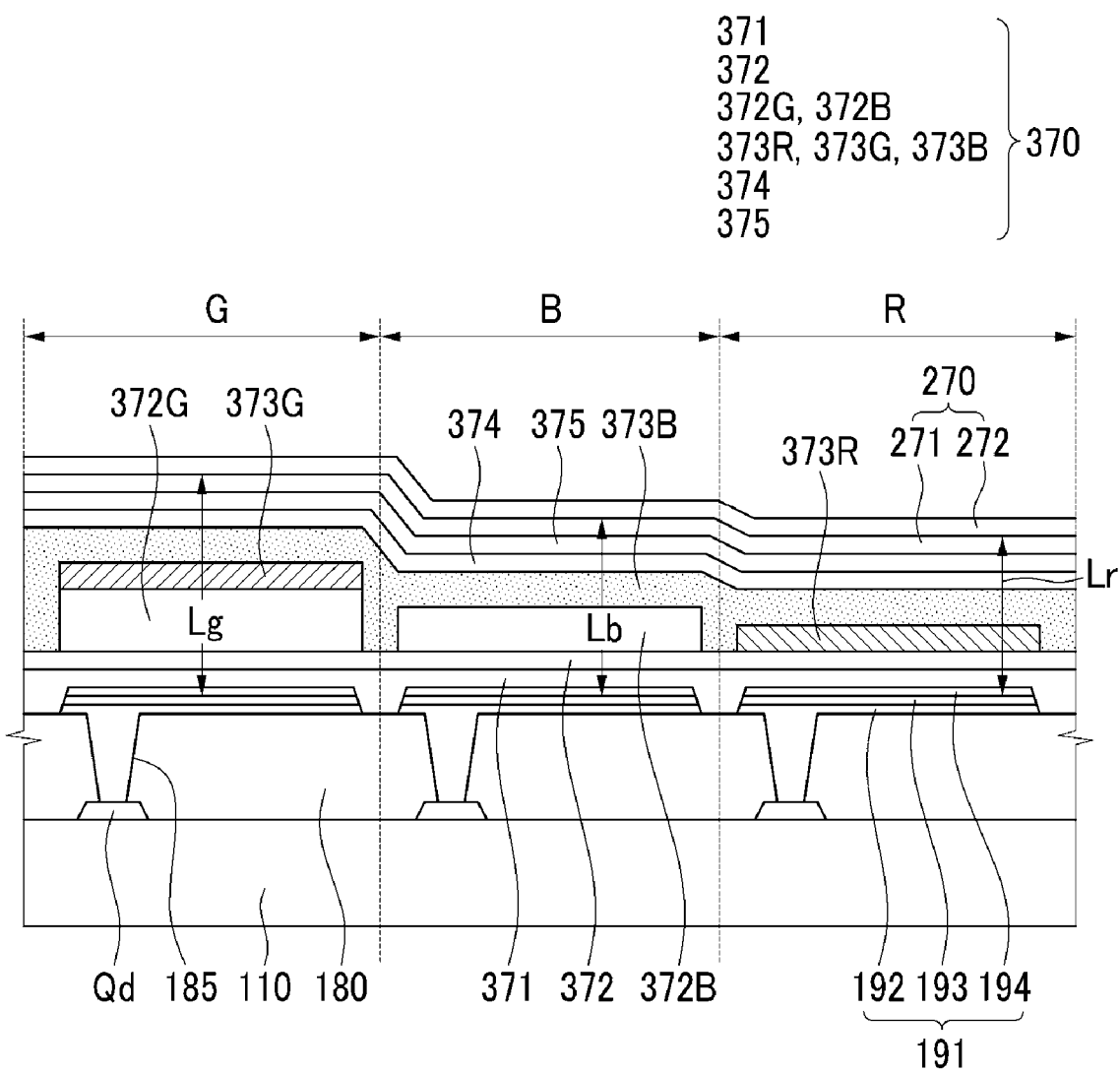
FIG. 3 is a cross-sectional view of three pixels in an organic light emitting device according to an exemplary embodiment of the present invention.

FIG. 3 is a cross-sectional view of three pixels in an organic light emitting device according to an exemplary embodiment of the present invention.

A plurality of driving transistors Qd are formed on an insulation substrate 110 made of transparent glass or plastic. Also, a plurality of signal lines (not shown) and a plurality of switching transistors (not shown) may be further formed on the insulation substrate 110.

A passivation layer 180 made of an inorganic material or an organic material is formed on the driving transistors Qd. When the passivation layer 180 is made of the organic material, the surface thereof may be flat.

The passivation layer 180 has a contact hole 185 exposing the driving transistor Qd.

A pixel electrode 191 including a lower conductive oxide member 192, a reflective layer 193, and an upper conductive oxide member 194 is formed on the passivation layer 180 of each pixel R, G, and B.

The lower conductive oxide member 192 and the upper conductive oxide member 194 may be made of a transparent conductive oxide such as indium tin oxide (ITO) or indium zinc oxide (IZO). The lower and upper conductive oxide members 192 and 194 improve the adhesion between the reflective layer 193 and another layer, and prevent corrosion therebetween. Particularly, the lower conductive oxide member 192 may protect the reflective layer 193 from oxygen or moisture that may be emitted from the passivation layer 180. One or both of the lower conductive oxide member 192 and the upper conductive oxide member 194 are optional layers.

The reflective layer 193 is disposed between the lower conductive oxide member 192 and the upper conductive oxide member 194. The reflective layer 193 may be made of a metal having high reflectance such as Ag, Al, or alloys thereof.

A plurality of insulating members (not shown) may be formed between the pixel electrodes 191 for insulation.

A hole injection layer 371 and a hole transport layer 372 are sequentially deposited on the whole surface of the pixel electrode 191 in the red, green, and blue pixels R, G, and B. The thickness of the hole transport layer 372 may be in the range of 20-70 nm.

The first distance additional member 372G is formed on the hole transport layer 372 of the green pixel G, and the second distance additional member 372B is formed on the hole transport layer 372 of the blue pixel B. The first distance additional member 372G is thicker than the second distance additional member 372B. The thickness of the first distance additional member 372G may be in the range of 50-80 nm, and the thickness of the second distance additional member 372B may be in the range of 30-50 nm. The first distance additional member 372G and the second distance additional member 372B are layers to control resonance distance for each color, and may be made of the same material as the hole transport layer 372. Although the thickness of the hole transport layer 372 is increased, an increase of the amount of current required to operate the organic light emitting device occurs such that the distance additional members 372G and 372B may be formed without significantly affecting the performance characteristics of the organic light emitting device.

A red organic emission layer 373R is deposited on the hole transport layer 372 of the red pixel R, and a green organic emission layer 373G is deposited on the first distance additional member 372G of the green pixel G. Also, a blue organic emission layer 373B is formed on the whole surface of the red and green organic emission layers 373R and 373G, and the second distance additional member 372B. The thickness of the blue organic emission layer is in the range of 10-40 nm. The red, green, and blue organic emission layers 373R, 373G, and 373B may be made of an organic material that emits red, green, or blue light.

Also, to prevent color mixture, the organic light emitting material having a hole mobility of the host of the red/green organic emission layer 373R/G may be used, which has a hole mobility that is less than the hole mobility of the host of the blue organic emission layer 373B. Using the organic light emitting material with the hole mobility of the host of the red/green organic emission layer 373R/G may allow the electrons and holes to be combined and light to be emitted in the red/green organic emission layer 373R/G of the red/green pixel R/G, and the thickness of the organic emission layers 373R, 373G, and 373B may be appropriately controlled. The red and green organic emission layers 373R and 373G may be made of a hole transmitting material of a triphenylamino group such as N,N-di (naphthalene-1-yl)-N,N-diphenyl-benzidene (NPB) and tetraphenylbenzidine (TPB), a carbazole derivative such as 4,4'-N,N'-dicarbazole-biphenyl (CBP), N,N-dicarbazolyl-3,5-benzene (mCP), and 4,4',4"-tri(N-carbazolyl)triphenylamine (TcTa), and a metallic complex such as phenyloxazole (ZnPBO) and phenylthiazole (ZnPBT).

An electron transport layer 374 and an electron injection layer 375 are sequentially formed on the whole surface of the blue organic emission layer 373B.

The hole injection layer 371, the hole transport layer 372, the electron transport layer 374, and the electron injection layer 375 may increase the emission efficiency of the organic emission layer 373R, 373G, and 373B. The hole transport layer 372 and the electron transport layer 374 may balance the electrons and holes. The hole injection layer 371 and the electron injection layer 375 may enhance the injection of the electrons and holes.

The hole injection layer 371, the hole transport layer 372, the first and second distance additional members 372G and 372B, the organic emission layers 373R, 373G, and 373B, the electron transport layer 374, and the electron injection layer 375 together form an organic light emitting member 370.

A common electrode 270 transmitting a common voltage Vss is formed on the electron injection layer 375. The common electrode 270 is made of two layers including a lower layer 271 and an upper layer 272, and has a transflective characteristic of reflecting a portion of the light and transmitting the rest. The lower layer 271 may be made of an alloy of Mg and Ag in a ratio of about 10:1, and the upper layer 272 may be made of Ag. Even if the lower layer 271 and the upper layer 272 are made of a metal having a reflective characteristic, if the metal is thin, it may have a transflective characteristic in which incident light is both reflected and transmitted. The thickness of the common electrode 270 may be in the range of about 50 Å-250 Å. The resistance of the upper layer 272 may be lower than the resistance of the lower layer 271, and the work function of the lower layer 271 may be lower and the injection rate may be relatively higher. Also, the upper layer 272 may be made of Ca, Al, or Ag, and the lower layer 271 may be made of alloys thereof or a Mg alloy. Also, the common electrode 270 may be made of a single layer.

An encapsulation layer (not shown) may be formed on the common electrode 270. The encapsulation layer encapsulates the organic light emitting member 370 and the common electrode 270, thereby preventing penetration of moisture and/or oxygen from the outside.

In the organic light emitting device, a pixel electrode 191, a light emitting member 370, and the common electrode 270 form an organic light emitting diode LD. The pixel electrode 191 may receive a voltage from the driving transistor Qd through the contact hole 185 of the passivation layer 180.

This organic light emitting device displays images by emitting the light toward the common electrode 270. The light emitted from the organic emission layers 373R, 373G, and 373B toward the common electrode 270 arrives at the common electrode 270, and then a portion of the light passes through the common electrode 270 to the outside, and the rest is reflected toward the pixel electrode 191. The pixel electrode 191 again reflects the light toward the common electrode 270. Accordingly, the light reciprocating between the pixel electrode 191 and the common electrode 270 generates an interference, and the light having a wavelength corresponding to the distance between the pixel electrode 191 and the common electrode 270 generates constructive interference and thereby the intensity of the corresponding light is enhanced. However the light of the remaining wavelengths generates a destructive interference and thereby the intensity of the reflected light is weaker. The reciprocating and interference processes are referred to as a microcavity effect.

Here, the optical distance of the microcavity is varied according to the thickness and the refractive indices of thin films between the pixel electrode 191 and the common electrode 270, such that the light of a wavelength corresponding to each of the primary colors may generate the resonance, thereby enhancing the intensity of the primary colors by appropriately selecting the thickness and materials of the thin films.

In the case of FIG. 3, the optical distance between the pixel electrode 191 and the common electrode 270 is determined by the thickness and the refractive index of the hole injection layer 371, the hole transport layer 372, the red organic emission layer 373R, the blue organic emission layer 373B, the electron transport layer 374, and the electron injection layer 375 in the red pixel R. The optical distance between the pixel electrode 191 and the common electrode 270 is also determined by the thickness and the refractive index of the hole injection layer 371, the hole transport layer 372, the first distance additional member 372G, the green organic emission layer 373G, the blue organic emission layer 373B, the electron transport layer 374, and the electron injection layer 375 in the green pixel G. The optical distance between the pixel electrode 191 and the common electrode 270 is also determined by the thickness and the refractive index of the hole injection layer 371, the hole transport layer 372, the second distance additional member 372B, the blue organic emission layer 373B, the electron transport layer 374, and the electron injection layer 375 in the blue pixel B.

The condition of the micro-cavity portion generating the resonance of the light is as following.

$$\frac{2L}{\lambda} + \frac{\phi}{2\pi} = m$$

Here, L is the optical distance between the pixel electrode 191 and the common electrode 270, λ is the wavelength of the light, Φ is a value representing the phase shift generated when the light is reflected between the pixel electrode 191 and the common electrode 270 as a radian, and m is a resonance order as an integral number.

In the organic light emitting device according to an exemplary embodiment of the present invention, the optical distance L between the pixel electrode 191 and the common electrode 270 is different in the red pixel R, the green pixel G, and the blue pixel B, thereby forming the optical distances respectively generating the resonance for the red light, the green light, and the blue light. Here, in the case of the red pixel R, the resonance order is determined to be lower by 1 than that of at least one of the green pixel G and the blue pixel B. For an example, it is determined that m=0 in the red pixel R, and m=1 in the green pixel G and the blue pixel B. Thus, the emission efficiency of the red light may be improved, and the mixture of the blue light generated due to the whole surface formation of the blue organic emission layer 373B may be prevented.

Figure 4:
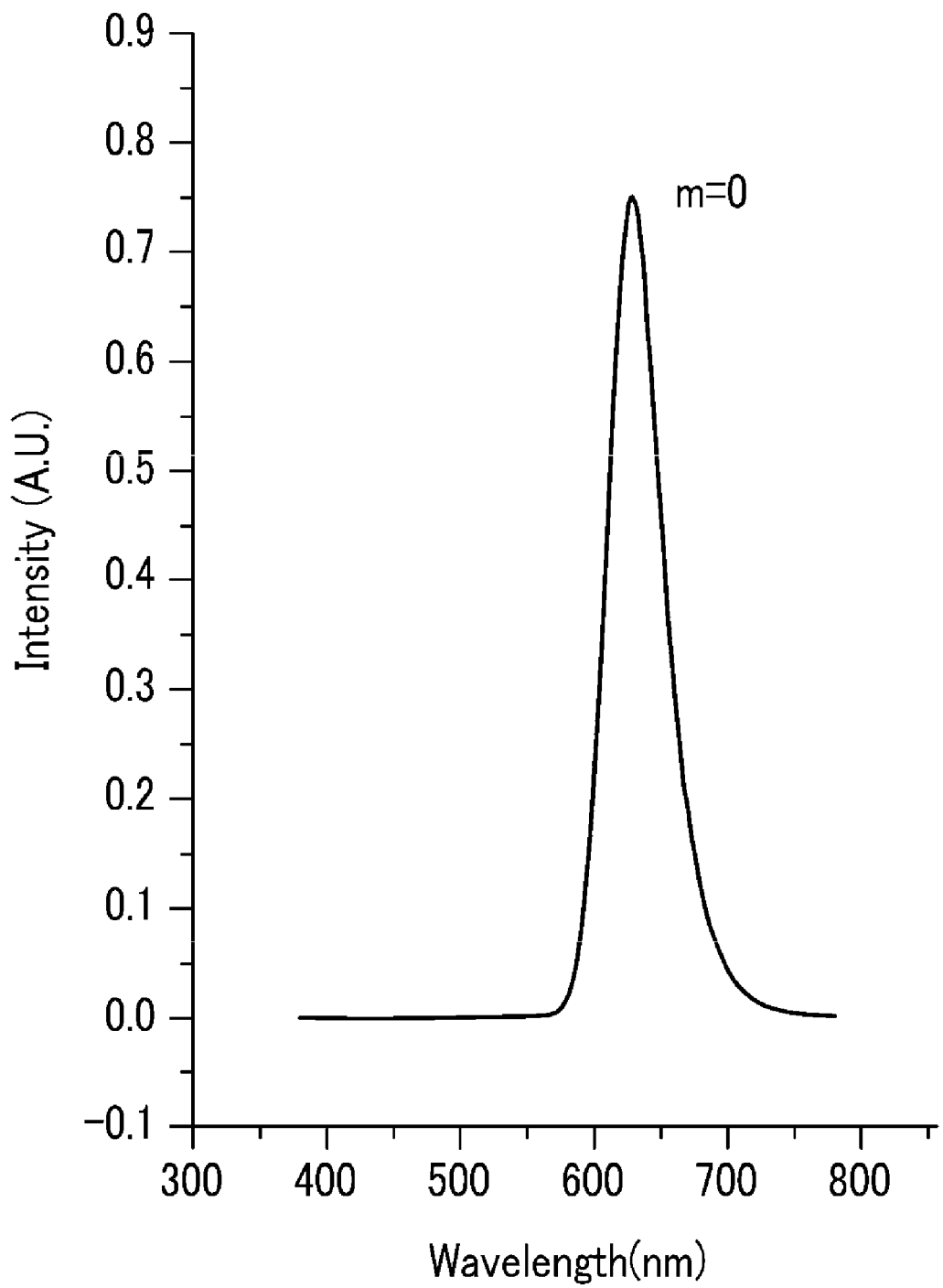
FIG. 4 shows a spectrum of emitted light in an organic light emitting device according to an exemplary embodiment of the present invention including a red emission layer having a resonance order of 0.
Figure 5:
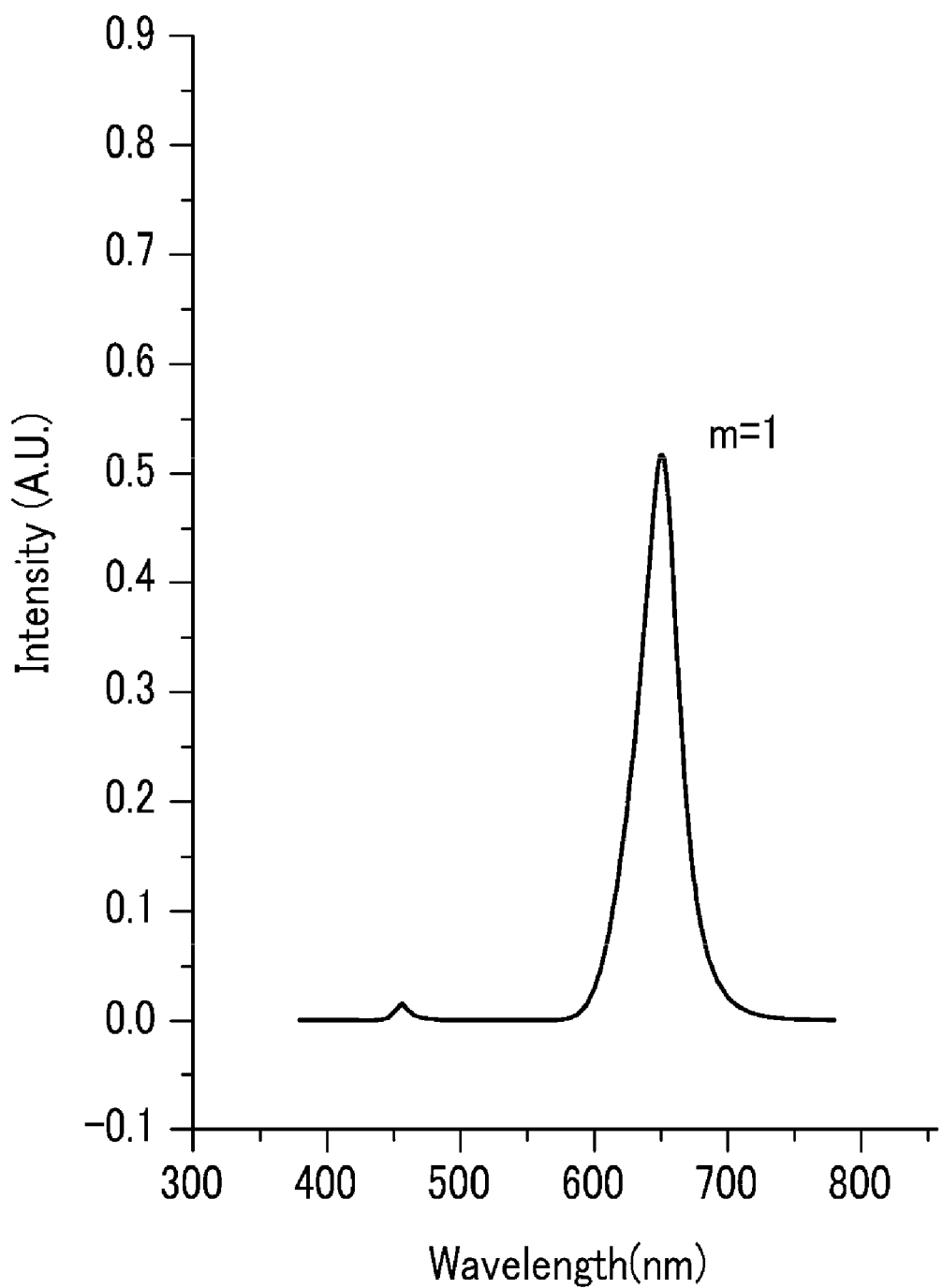
FIG. 5 shows a spectrum of emitted light in an organic light emitting device according to an exemplary embodiment of the present invention including a red emission layer having a resonance order of 1.

FIG. 4 shows a spectrum of emitted light in an organic light emitting device according to an exemplary embodiment of the present invention including a red emission layer having a resonance order m of 0, and FIG. 5 shows a spectrum of emitted light in the case including a red emission layer having a resonance order m of 1.

In the case of FIG. 5, a small peak appears near 450 nm that is the blue wavelength, and this means that the blue light is mixed. However, in the case of FIG. 4, the peak does not appear in the blue wavelength region such that it is confirmed that red light of high purity is emitted without the blue light mixture. Also, the size of the peak of FIG. 4 is larger than the peak of FIG. 5, and this means that the efficiency of the emission is increased by that amount.

In the case of the blue pixel B and the green pixel G, to improve the emission efficiency or the color purity, it may be advantageous to determine the resonance order m to be 0. However if the thickness of the organic light emitting member 370 is excessively small, a current leakage may be generated. Therefore the resonance order m of the blue pixel B and the green pixel G is determined to be 1 and thereby higher than the resonance order of the red pixel R.

When the resonance orders m of the red pixel R, the green pixel G, and the blue pixel B are all the same, the optical distances Lr, Lg, and Lb of each pixel satisfies Lr>Lg>Lb. However, in an exemplary embodiment of the present invention, it is determined that the resonance order of the red pixel R is lower than that of the green pixel G and the blue pixel B such that the optical distances Lr, Lg, and Lb are Lg>Lb>Lr.

In the above-described exemplary embodiment, the pixel electrode 191 has the reflective layer 193, and the common electrode 270 have the transflective characteristic such that the top emission type organic light emitting device is described, in which the light is emitted through the common electrode 270. If the reflective layer 193 of the pixel electrode 191 is replaced with a transflective layer, and the common electrode 270 is thick to thereby reflect light, an organic light emitting device of a bottom emission type in which the light is emitted through the substrate 110 may be obtained.

Next, a manufacturing method of an organic light emitting device according to an exemplary embodiment of the present invention will be described.

Firstly, referring to FIG. 3, a plurality of driving transistors Qd are formed on an insulation substrate 110, and a passivation layer 180 having a plurality of contact holes 185 is formed thereon.

Next, a lower conductive oxide member 192, a reflective layer 193, and an upper conductive oxide member 194 are deposited on the passivation layer 180 of the pixels R, G, and B to form a pixel electrode 191.

Next, a hole injection layer 371 and a hole transport layer 372 are sequentially deposited.

Next, the first distance additional member 372G is formed on the hole transport layer 372 of the green pixel G, and a second distance additional member 372B is formed on the hole transport layer 372 of the blue pixel B. Here, by using a shadow mask, the first distance additional member 372G and the second distance additional member 372B are only formed in a predetermined region.

Next, a red organic emission layer 373R is formed on the hole transport layer 372 of the red pixel R, and a green organic emission layer 373G is formed on the first distance additional member 372G. Here, the shadow mask is used to deposit the red organic emission layer 373R and the green organic emission layer 373G only on a predetermined region.

Next, the blue organic emission layer 373B is formed on the red organic emission layer 373R, the green organic emission layer 373G, and the second distance additional member 372B. The blue organic emission layer 373B is formed on the whole surface such that the shadow mask is not necessary.

Accordingly, the shadow mask is not necessary when forming the blue organic emission layer 373B such that the manufacturing process and the time therefore may be reduced, and the product inferiority rate according to the usage of the shadow mask may be reduced.

Next, the electron transport layer 374, the electron injection layer 375, and the common electrode 270 are sequentially deposited on the blue organic emission layer 373B.

In another exemplary embodiment of the present invention, the deposition sequence of the organic emission layers 373R, 373G, and 373B may be changed. Also, in the organic light emitting device according to an exemplary embodiment of the present invention, the red pixel R may further include a red color filter, the green pixel G may further include a green color filter, and the blue pixel B may further include a blue color filter for realizing color clarity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
a first pixel to display a first color light, a second pixel to display a second color light, and a third pixel to display a third color light,
wherein each of the first pixel, the second pixel, and the third pixel comprises
a pixel electrode,
a third color organic emission layer disposed on the pixel electrode,
a common electrode disposed on the third color organic emission layer, and
a hole injection layer and a hole transport layer disposed on the whole surface of the pixel electrode of the first pixel, the second pixel and the third pixel,
wherein the first pixel further comprises a first color organic emission layer disposed between the pixel electrode and the common electrode,
wherein the second pixel further comprises a second color organic emission layer and a first distance additional member between the pixel electrode and the common electrode,
wherein the third pixel further comprises a second distance additional member disposed between the pixel electrode and the common electrode, wherein the first distance additional member is thicker than the second distance additional member, and wherein the first additional member and the second additional member are made of the same material of the hole transport layer,
wherein the distances between the pixel electrode and the common electrode of the first pixel, the second pixel, and the third pixel are referred to as a first resonance distance, a second resonance distance, and a third resonance distance, respectively, and
a resonance order of the first color light for the first resonance distance is lower than at least one of resonance orders of the second color light and the third color light for the second resonance distance and the third resonance distance, respectively.

2. The organic light emitting device of claim 1, wherein the resonance order of the first color light for the first resonance distance is 0, and the resonance order of the second color light and the third color light for the second resonance distance and third resonance distance are both 1.

3. The organic light emitting device of claim 2, wherein the hole injection layer and the hole transport layer are disposed between the pixel electrodes and the first color organic emission layer, the second color organic emission layer, and the third color organic emission layer,
the first pixel, the second pixel, and the third pixel each further comprise an electron transport layer and an electron injection layer disposed between the third color organic emission layer and the common electrode,
the first distance additional member is disposed between the hole transport layer and the second color organic emission layer, and
the second distance additional member is disposed between the hole transport layer and the third color organic emission layer.

4. The organic light emitting device of claim 1, wherein the thickness of the first distance additional member is in the range of about 50-80 nm, and the thickness of the second distance additional member is in the range of about 30-50 nm.

5. The organic light emitting device of claim 4, wherein the first color light is red, the second color light is green, and the third color light is blue.

6. The organic light emitting device of claim 5, wherein the thickness of the hole transport layer is in the range of about 20-70 nm.

7. The organic light emitting device of claim 6, wherein the thickness of the third color organic emission layer is in the range of about 10-40 nm.

8. The organic light emitting device of claim 1, wherein the pixel electrode comprises a reflective layer, and the common electrode comprises a transflective layer.

9. The organic light emitting device of claim 1, wherein the pixel electrode comprises a transflective layer, and the common electrode comprises a reflective layer.

10. An organic light emitting device, comprising:
a red pixel, a green pixel, and a blue pixel,
wherein the red pixel, the green pixel, and the blue pixel each comprise
a pixel electrode,
a blue organic emission layer disposed on the pixel electrode, and
a common electrode disposed on the blue organic emission layer,
wherein the red pixel further comprises a red organic emission layer disposed between the pixel electrode and the common electrode, and wherein
a hole injection layer and a hole transport layer are disposed on the whole surface of the pixel electrode of the red pixel, the green pixel and the blue pixel, wherein the green pixel further comprises a green organic emission layer and a first distance additional member disposed between the pixel electrode and the common electrode, wherein the blue pixel further comprises a second distance additional member disposed between the pixel electrode and the common electrode, wherein the distance between the pixel electrode and the common electrode of the red pixel is shorter than the distance between the pixel electrode and the common electrode of the green pixel and the blue pixel, and wherein the first distance additional member is thicker than the second distance additional member, and wherein the first additional member and the second additional member are made of the same material of the hole transport layer.

11. The organic light emitting device of claim 10, wherein the distance between the pixel electrode and the common electrode of the green pixel is longer than the distance between the pixel electrode and the common electrode of the blue pixel.

12. The organic light emitting device of claim 11, wherein the hole injection layer and the hole transport layer are disposed between the pixel electrode and the red organic emission layer, the green organic emission layer, and the blue organic emission layer, respectively, the red pixel, the green pixel, and the blue pixel each further comprise an electron transport layer and an electron injection layer disposed between the blue organic emission layer and the common electrode, the first distance additional member is disposed between the hole transport layer and the green organic emission layer, and the second distance additional member is disposed between the hole transport layer and the blue organic emission layer.

13. The organic light emitting device of claim 10, wherein the thickness of the first distance additional member is in the range of about 50-80 nm, and the thickness of the second distance additional member is in the range of about 30-50 nm.

14. The organic light emitting device of claim 13, wherein the thickness of the hole transport layer is in the range of about 20-70 nm.

15. The organic light emitting device of claim 14, wherein the thickness of the blue organic emission layer is in the range of about 10-40 nm.

16. The organic light emitting device of claim 10, wherein the pixel electrode comprises a reflective layer and the common electrode comprises a transflective layer.

17. The organic light emitting device of claim 1, wherein the first distance additional member comprises a thickness range of 50nm to 80 nm.

18. The organic light emitting device of claim 1, wherein the second distance additional member comprises a thickness range of 30nm to 50 nm.

19. The organic light emitting device of claim 1, wherein the hole injection layer is disposed directly on an upper surface and a side surface of the pixel electrode of the first pixel, the second pixel and the third pixel.

20. The organic light emitting device of claim 10, wherein the hole injection layer is disposed directly on an upper surface and a side surface of the pixel electrode of the first pixel, the second pixel and the third pixel.

* * * * *